(12) United States Patent
Li et al.

(10) Patent No.: US 10,312,231 B2
(45) Date of Patent: Jun. 4, 2019

(54) ARRAY SUBSTATE AND DISPLAY DEVICE

(71) Applicant: BOE TECHNOLOGY GROUP CO., LTD., Beijing (CN)

(72) Inventors: Wenbo Li, Beijing (CN); Jianbo Xian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/507,515

(22) PCT Filed: Feb. 19, 2016

(86) PCT No.: PCT/CN2016/074118
§ 371 (c)(1),
(2) Date: Feb. 28, 2017

(87) PCT Pub. No.: WO2017/036103
PCT Pub. Date: Mar. 9, 2017

(65) Prior Publication Data
US 2017/0294433 A1 Oct. 12, 2017

(30) Foreign Application Priority Data
Sep. 2, 2015 (CN) .................. 2015 2 0679430 U

(51) Int. Cl.
*H01L 27/02* (2006.01)
*G02F 1/1362* (2006.01)
*H01L 27/12* (2006.01)

(52) U.S. Cl.
CPC ........ *H01L 27/0266* (2013.01); *G02F 1/1362* (2013.01); *H01L 27/124* (2013.01)

(58) Field of Classification Search
CPC . H01L 23/30; H01L 27/0248; H01L 27/0266; H01L 27/0292; H01L 27/124
See application file for complete search history.

(56) References Cited

U.S. PATENT DOCUMENTS 6,166,713 A 12/2000 Asai et al.
6,333,661 B1 12/2001 Ando et al.
(Continued)

FOREIGN PATENT DOCUMENTS

CN 101192379 A 6/2008
CN 102629049 A 8/2012
(Continued)

OTHER PUBLICATIONS

Search Report and Written Opinion dated May 30, 2016 from State Intellectual Property Office of the P.R. China.
Extended European Search Report dated Mar. 19, 2019.

*Primary Examiner* — Cuong Q Nguyen
(74) *Attorney, Agent, or Firm* — Dilworth & Barrese, LLP.; Michael J. Musella, Esq.

(57) ABSTRACT

Disclosed are an array substrate and a display device, which can achieve protection of a signal line against static electricity and meanwhile decrease a load on the signal line, so as to improve product yield. The array substrate includes a first signal line, a second signal line and an electrostatic protection device; wherein the electrostatic protection device includes a suspension Thin Film Transistor (TFT), a source electrode of the suspension TFT is connected with the first signal line, a gate electrode of the suspension TFT is connected with the second signal line, and a drain electrode of the suspension TFT is suspended; and wherein the drain electrode and the gate electrode have an overlapping region. The display device includes the above-mentioned array substrate.

20 Claims, 6 Drawing Sheets

(56) References Cited

U.S. PATENT DOCUMENTS

| | | |
|---|---|---|
| 6,384,878 B1 | 5/2002 | Kwak |
| 2008/0135846 A1 | 6/2008 | Shin et al. |
| 2010/0155724 A1 | 6/2010 | Hong et al. |

FOREIGN PATENT DOCUMENTS

| | | |
|---|---|---|
| CN | 204883133 U | 12/2015 |
| CN | 101285974 A | 2/2017 |

ARRAY SUBSTATE AND DISPLAY DEVICE

TECHNICAL FIELD

Embodiments of the present disclosure relate to an array substrate and a display device.

BACKGROUND

At present, with constant improvement of people's living standard, display products are more and more widely applied, and people pose higher and higher demand on quality of the display products. However, the display product may be influenced by static electricity in the production, transportation and working process, and hence cannot meet the demand for high-quality display.

In an array substrate of an existing display device, several suspension protection capacitors generally are arranged on a signal line (a data line or a gate line) so as to prevent breakdown of the signal line due to static electricity. For example, as illustrated in FIG. 1, a plurality of suspension protection capacitors 10 can be arranged on a data line 103. FIG. 2 is a sectional view of FIG. 1 along AA', and illustrates the suspension protection capacitor having a structure of three layers, that is, a suspension electrode 101, an intermediate layer 102 and the data line 103, wherein the suspension electrode 101 can be formed along with a gate electrode of a thin film transistor, and the intermediate layer 102 usually is a gate insulating layer; and when high-voltage static electricity is existed on the data line 103, the static electricity can be subjected to partial voltage storage by the suspension protection capacitor 10 formed between the suspension electrode 101 and the data line 103, so as to prevent breakdown of the data line 103 due to the static electricity and guarantee a display effect of the display device. However, in such method, the data line 103 has to be used as one of the electrodes of the suspension protection capacitor 10, which may increase a load of the data line 103 and influence normal transmission of a signal on the data line 103 so as to influence a product yield.

SUMMARY

At least one embodiment of the present disclosure provide an array substrate and a display device which can achieve protection of a signal line against static electricity and meanwhile decrease a load on the signal line, so as to improve product yield.

On one aspect, embodiments of the present disclosure provide an array substrate, including a first signal line, a second signal line and an electrostatic protection device, wherein the electrostatic protection device comprises a suspension Thin Film Transistor (TFT), wherein a source electrode of the suspension TFT is connected with the first signal line, a gate electrode of the suspension TFT is connected with the second signal line, and a drain electrode of the suspension TFT is suspended; and the drain electrode and the gate electrode have an overlapping region.

In an example, every first signal line is connected to at least two electrostatic protection devices.

In an example, drain electrodes of suspension TFTs in the electrostatic suspension devices connected to a same first signal line are electrically connected with each other.

In an example, gate electrodes of suspension TFTs in the electrostatic suspension devices connected to a same first signal line are electrically connected with each other.

In an example, the suspension TFT further includes an active layer arranged between the gate electrode and the drain electrode, and active layers of suspension TFTs in the electrostatic protection devices connected to a same first signal line are electrically connected with each other.

In an example, suspension TFTs in the electrostatic protection devices connected to two adjacent first signal lines share a same drain electrode and a same gate electrode.

In an example, the electrostatic protection device is connected with two adjacent first signal lines at the same time.

In an example, the source electrode of the suspension TFT is selected from a group consisted of a U-shaped electrode, an L-shaped electrode and a W-shaped electrode.

In an example, the array substrate further includes a common electrode line, wherein the second signal line is electrically connected with the common electrode line.

In an example, the array substrate further includes a first anti-static unit, wherein an input end of the first anti-static unit is connected with the second signal line, and an output end of the first anti-static unit is electrically connected with the common electrode line.

In an example, the first signal line is a gate line or a data line.

In an example, the array substrate further includes a second anti-static unit and a short circuit ring, wherein an input end of the second anti-static unit is connected with the first signal line, and an output end of the second anti-static unit is connected with the short circuit ring.

On another aspect, embodiments of the present disclosure further provide a display device, including any of the above-mentioned array substrates.

BRIEF DESCRIPTION OF THE DRAWINGS

Hereafter, the embodiments of the present invention will be described in a more detailed way with reference to the accompanying drawings, so as make one person skilled in the art be able to understand the present invention more clearly, wherein.

DETAILED DESCRIPTION

Hereafter, the technical solutions in the embodiments of the present disclosure will be described in a clearly and fully understandable way in connection with the drawings in the embodiments of the present disclosure. It is obvious that the described embodiments are just a part but not all of the embodiments of the disclosure. Based on the described embodiments herein, one person skilled in the art can obtain other embodiment(s), without any inventive work, which should be within the scope of the disclosure.

Unless otherwise defined, the technical terminology or scientific terminology used herein should have the same meaning as commonly understood by one of ordinary skill in the art to which this invention belongs. Likewise, terms like "first," "second," etc., which are used in the description and the claims of the present application for invention, are not intended to indicate any sequence, amount or importance, but distinguish various components. The phrases "connect", "connected", etc., are not intended to define a physical connection or mechanical connection, but may include an electrical connection, directly or indirectly. "On," "under," "left," "right" or the like is only used to describe a relative positional relationship, and when the absolute position of a described object is changed, the relative positional relationship might also be changed accordingly.

Figure 1:
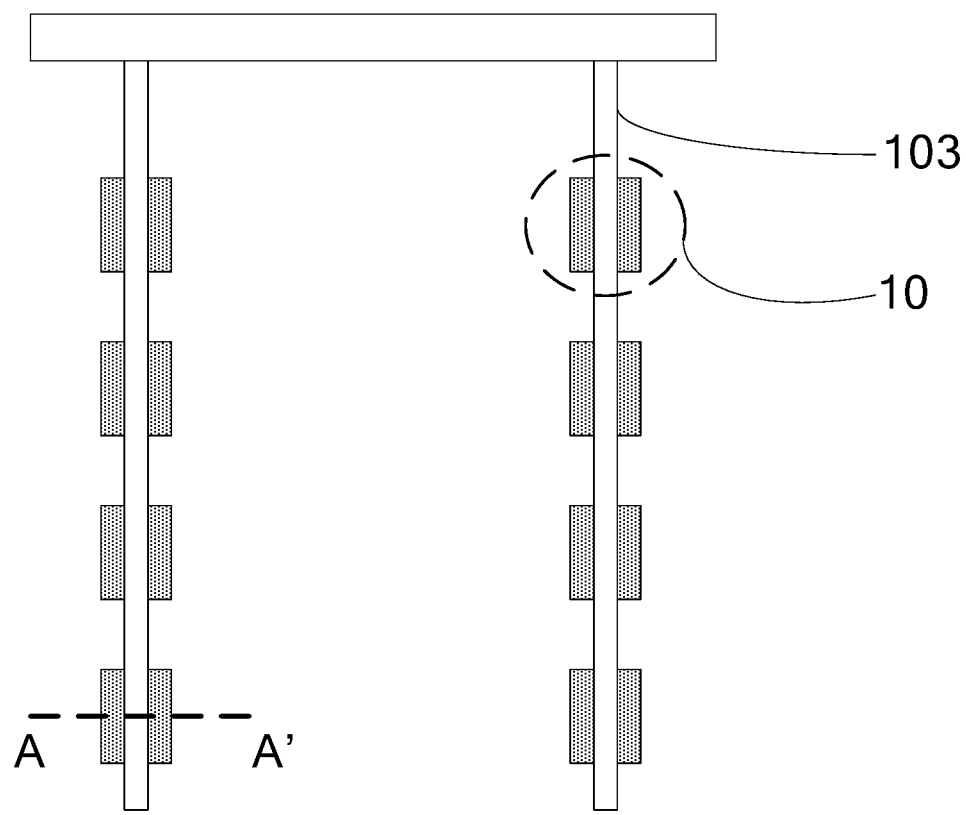
FIG. 1 is a schematic diagram illustrating partial structure of a known array substrate.
Figure 2:
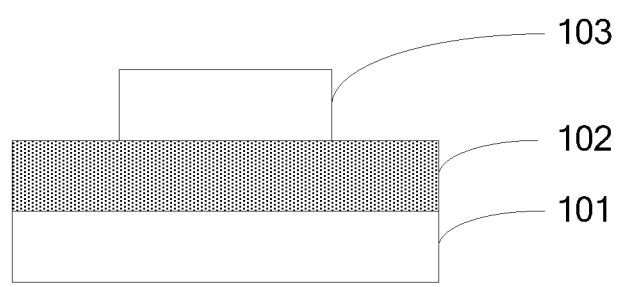
FIG. 2 is a sectional view illustrating the structure of the known suspension capacitor.
Figure 3:
FIG. 3 is a schematic diagram illustrating partial structure of an array substrate provided by an embodiment of the present disclosure.

An embodiment of the present disclosure provides an array substrate. As illustrated in FIG. 3, in one example, the array substrate includes: a first signal line 31, a second signal line 32 and an electrostatic protection device, wherein the electrostatic protection device includes a suspension thin film transistor (TFT) 33, a source electrode 331 of the suspension TFT 33 is connected with the first signal line 31, a gate electrode 333 of the suspension TFT 33 is connected with the second signal line 32, and a drain electrode 332 of the suspension TFT 33 is suspended; and the drain electrode 332 and the gate electrode 333 have an overlapping region.

According to the embodiment of the present disclosure, the drain electrode 332 and the gate electrode 333 have an overlapping region such that when a voltage is applied on both the drain electrode 332 and the gate electrode 333, the drain electrode 332 and the gate electrode 333 of the suspension TFT 33 can form an electrostatic storage capacitor.

According to the embodiment of the present disclosure, the source electrode 331 of the suspension TFT 33 is connected with the first signal line 31 such that the first signal line 31 can supply the source electrode 331 of the suspension TFT 33 with a source voltage; the gate electrode 333 of the suspension TFT 33 is connected with the second signal line 32 such that the second signal line 32 can supply the gate electrode 333 of the suspension TFT 33 with a gate voltage; and the drain electrode 332 of the suspension TFT 33 is suspended, that is, the drain electrode 332 is not electrically connected with any conductive layer. In this way, at specific times or periodically, a gate-on voltage is provided to the second signal line 32 so as to turn on the suspension TFT 33; at this moment, if a great amount of electrostatic charges exist on the first signal line 31, the drain electrode 332 and the gate electrode 333 of the suspension TFT 33 form an electrostatic storage capacitor which can store the electrostatic charges on the first signal line 31.

As compared to the existing array substrate, the first signal line of the array substrate provided by the embodiment of the present disclosure is connected with the suspension TFT such that the first signal line supplies the suspension TFT with the source voltage, and the second signal line supplies the suspension TFT with the gate-on voltage at specific times or periodically so as to turn on the suspension TFT. Therefore, during a turn-on period of the suspension TFT, in case that there are electrostatic charges on the first signal line, the source voltage of the suspension TFT is increased, and then the source electrode and the drain electrode of the suspension TFT are conducted; in this way, a great amount of electrostatic charges are transferred into the electrostatic storage capacitor formed by the drain electrode and the gate electrode of the suspension TFT, and electrostatic breakdown of the first signal line is prevented; in case that the second signal line provides no gate-on voltage, the suspension TFT may be turned off, and then the first signal line and the suspension TFT are in a disconnected state, so that a load of the first signal line is reduced and a normal transmission of the signal on the first signal line is guaranteed, thereby improving the product yield.

The embodiment of the present disclosure does not limit the specific number of the electrostatic protection devices connected on the first signal line 31 or the specific number of the suspension TFTs 33 included in the electrostatic protection device, which can be flexibly arranged by those skilled in the art through comprehensively considering factors such as electrostatic protection capacity, cost, production process and the like.

It should be noted that the suspension TFT in the embodiment of the present disclosure can have the same process steps with at least one type of other thin film transistors in the array substrate, e.g., the suspension TFT can be produced and completed synchronously with a switching transistor and/or a driving transistor in the array substrate by using a photoetching process; and certainly, the suspension TFT also can be prepared by adopting other process steps, such as printing. The production method of the suspension TFT is not particularly limited in the embodiment of the present disclosure, and is not repeated herein.

In one example, every first signal line is connected with at least two electrostatic protection devices, so that the electrostatic protection capacity for the first signal line can be further reinforced and a probability for the first signal line to be broken down by the static electricity is reduced, without increasing the load of the first signal line. In practical application, four to six electrostatic protection devices can be connected on every first signal line to implement electrostatic protection for the first signal line.

Figure 4:
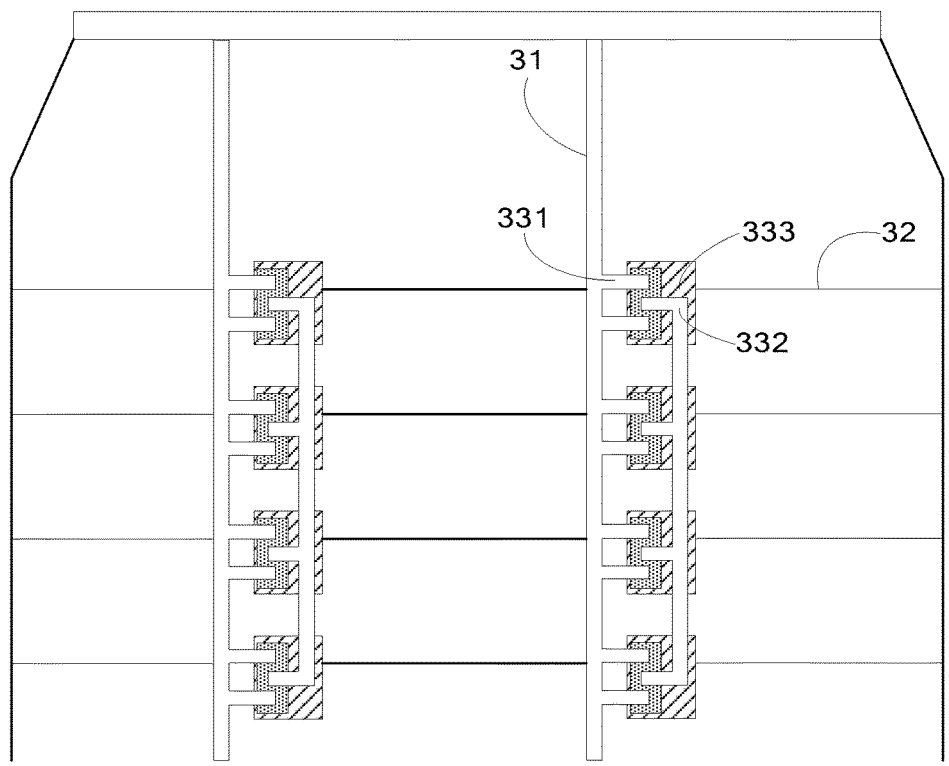
FIG. 4 is a schematic diagram illustrating partial structure of an array substrate provided by another embodiment of the present disclosure.

In one example, as illustrated in FIG. 4, the drain electrodes 332 of the suspension TFTs connected to a same first signal line 31 are electrically connected.

With reference to FIG. 4, the drain electrodes 332 of the suspension TFTs included in the electrostatic protection devices connected to the same first signal line 31 are connected together, so that areas of the drain electrodes 332 can be increased, thereby improving the charge storage capacity of the electrostatic storage capacitor formed by the drain electrode 332 and the gate electrode 333. In practical production process, the areas of the drain electrodes 332 can be made as large as possible, so that the charge storage capacity of the electrostatic storage capacitor can be further improved. It should be noted that, by connecting the drain electrodes 332 of the suspension TFTs included in the electrostatic protection devices connected to the same first signal line 31 together, a relatively large drain electrode is formed, and the relatively large drain electrode is still suspended, i.e., the relatively large drain electrode is not electrically connected with any conductive layer.

Figure 5:
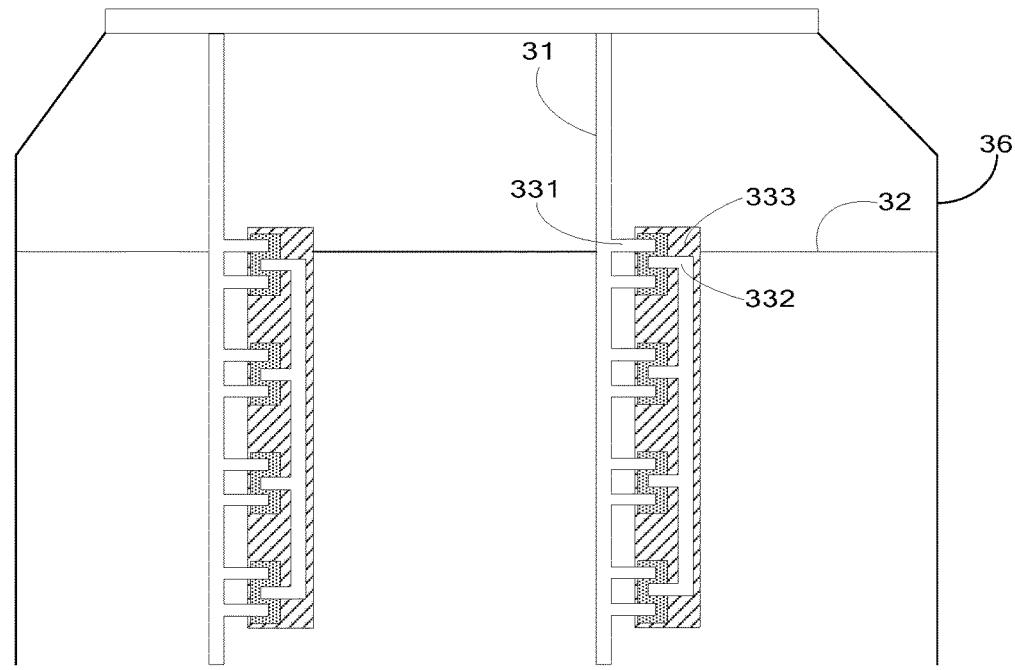
FIG. 5 is a schematic diagram illustrating partial structure of an array substrate provided by yet another embodiment of the present disclosure.

In one example, as illustrated in FIG. 5, the gate electrodes 333 of the suspension TFTs connected to a same first signal line 31 are electrically connected.

With reference to FIG. 5, the gate electrodes 333 of the suspension TFTs included in the electrostatic protection devices connected to the same first signal line 31 are connected together, so that areas of the gate electrodes 333 can be increased, thereby improving the charge storage capacity of the electrostatic storage capacitor formed by the drain electrodes 332 and the gate electrodes 333.

In one example, the drain electrode of the suspension TFT has a U shape, an L shape or a W shape.

In practical application, the source electrode of the suspension TFT can be configured to have the U shape, the L shape or the W shape, which is not particularly limited in the embodiment of the present disclosure. For example, with reference to FIG. 3, by configuring the drain electrode 331 of the suspension TFT 33 to have a U shape, a conduction area between the source electrode 331 and the drain electrode 332 can be increased; in this way, when a great amount of electrostatic charges on the first signal line 31 need to be transferred into the electrostatic storage capacitor formed by the drain electrode 332 and the gate electrode 333 of the suspension TFT 33, a relatively stronger charge conduction can be established between the drain electrode 331 and the drain electrode 332, so that a retention time of the static electricity on the first signal line 1 is reduced, thereby reducing the probability that the first signal line is broken down by the static electricity.

In one example, with reference to FIG. 5, the array substrate further includes a common electrode line 36, wherein the second signal line 32 is electrically connected with the common electrode line 36. By electrically connecting the second signal line 32 with the common electrode line 36, the gate voltage can be provided to the gate electrode 333 of the suspension TFT 33 through the common electrode line 36, which is simple and convenient to implement.

Figure 6:
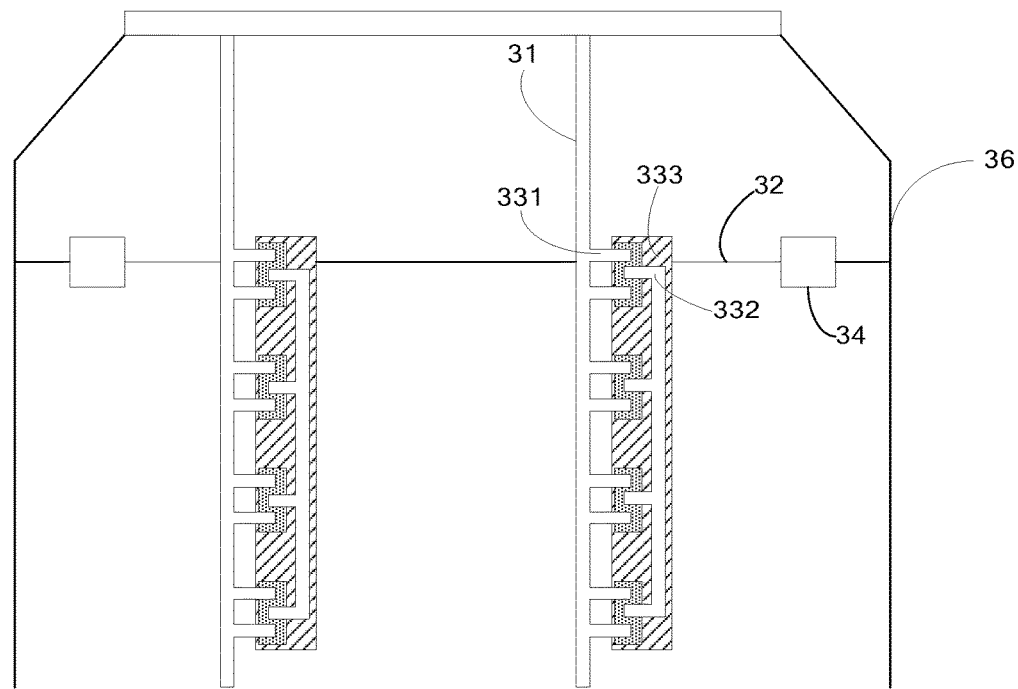
FIG. 6 is a schematic diagram illustrating partial structure of an array substrate provided by still another embodiment of the present disclosure.

In one example, as illustrated in FIG. 6, the array substrate further includes a first anti-static unit 34, wherein an input end of the first anti-static unit 34 is connected with the second signal line 32, and an output end of the first anti-static unit 34 is electrically connected with the common electrode line 36.

For example, the first anti-static unit 34 can have an Electro-Static Discharge (ESD) structure which generally includes a plurality of TFTs; by turning on the TFTs, the static electricity on a signal line being protected is transferred onto a dredging line so as to prevent electrostatic breakdown of the signal line being protected.

Therefore, by connecting the first anti-static unit 34 between the second signal line 32 and the common electrode line 36, both the first signal line 31 and the second signal line 32 can be protected against static electricity, wherein the first signal line 31 generally is a gate line or a data line.

Figure 7:
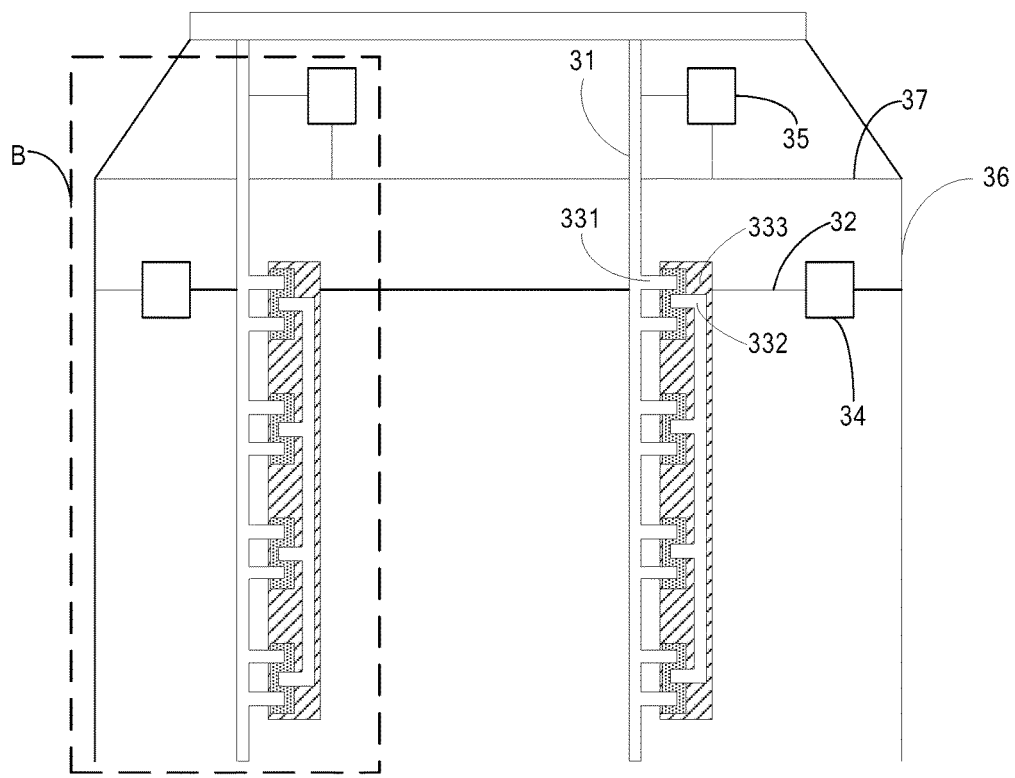
FIG. 7 is a schematic diagram illustrating partial structure of an array substrate provided by further another embodiment of the present disclosure.

In one example, as illustrated in FIG. 7, the array substrate further includes a second anti-static unit 35 and a short circuit ring 37, wherein an input end of the second anti-static unit 35 is connected with the first signal line 31, and an output end of the second anti-static unit 35 is connected with the short circuit ring 37.

For example, the second anti-static unit 35 has an ESD structure. Generally, in case that the first signal line 31 is being protected against the static electricity by using an ESD structure, since the ESD structure generally includes a plurality of TFTs, the TFTs are easily to be broken down to cause damage to the ESD structure when a great amount of static electricity exists on the first signal line 31, so that the number of times of protection, the time last for protection and the like of the ESD structure with respect to the first signal line 31 are limited, which may influence the effect of protection against static electricity. Therefore, in this example, the first signal line 31, on which the suspension TFT electrostatic protection device is arranged, is additionally connected with a second anti-static unit 35, so that the suspension TFT and the ESD structure are cooperated with each other to further reinforce the capacity of protection against static electricity for the first signal line 31.

Figure 8:
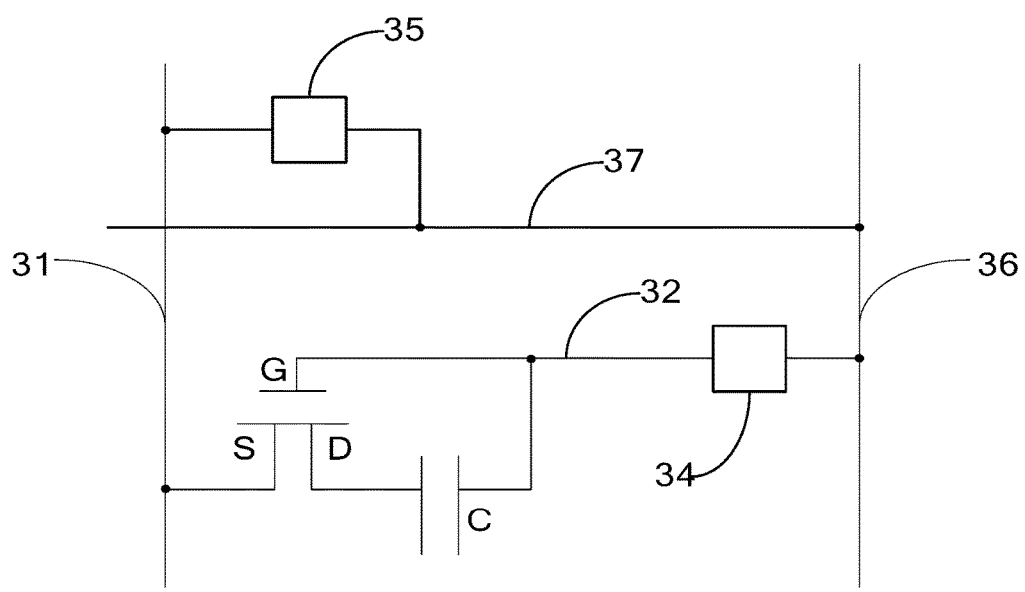
FIG. 8 is an equivalent circuit diagram of B region in FIG. 7.

FIG. 8 is an equivalent circuit diagram of a B region in FIG. 7. As illustrated in FIG. 8, the suspension TFT can be equivalent to a switching TFT with a switching effect and an electrostatic storage capacitor C. When electrostatic charges exist on the first signal line 31, the switching TFT is turned on and a part of the electrostatic charges on the first signal line 31 are transferred to and stored in the electrostatic storage capacitor C while the other part of the electrostatic charges on the first signal line 31 are dredged onto the short circuit ring 37 through the ESD structure, thereby preventing the first signal line from being broken down by the static electricity.

Figure 9:
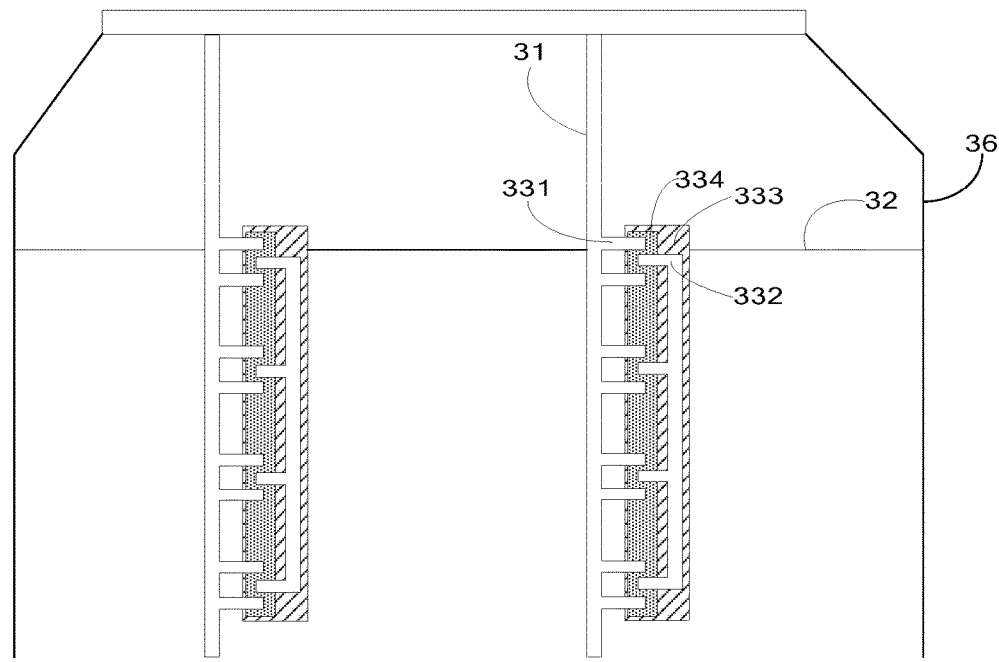
FIG. 9 is a schematic diagram illustrating partial structure of an array substrate provided by yet further another embodiment of the present disclosure.

In one example, as illustrated in FIG. 9, the suspension TFT 33 further includes an active layer 334 arranged between the gate electrode 333 and the drain electrode 332, and the active layers 334 of suspension TFTs 33 connected to a same first signal line 31 are electrically connected. In this way, a production process for the active layer 334 of the suspension TFT 33 can be simplified.

Figure 10:
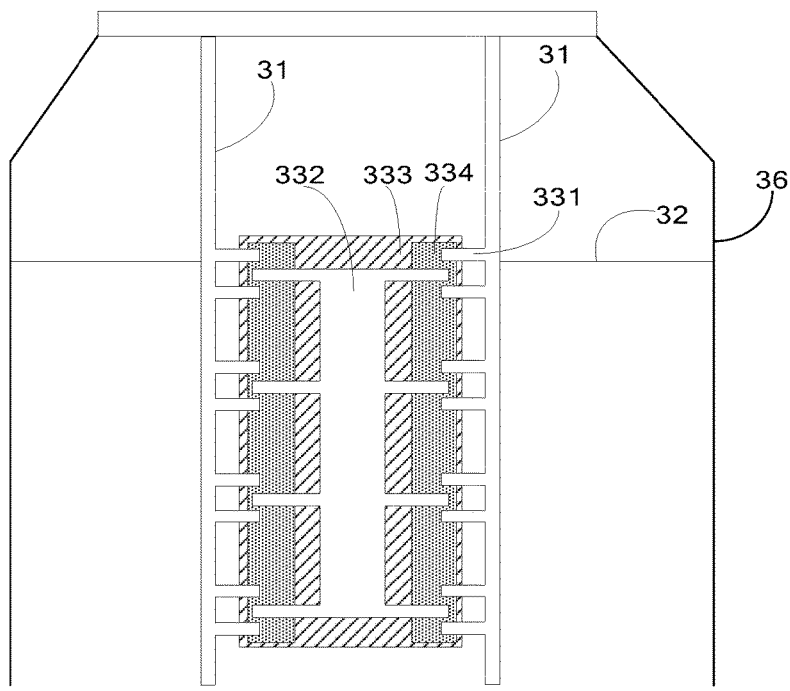
FIG. 10 is a schematic diagram illustrating partial structure of an array substrate provided by still further another embodiment of the present disclosure.

In one example, as illustrated in FIG. 10, the suspension TFTs 33 connected on two adjacent first signal lines 31 share the same drain electrode 332 and the same gate electrode 333. Therefore, the two adjacent first signal lines 31 can be protected against the static electricity at the same time, and the cost can be saved and the process can be simplified.

Figure 11:
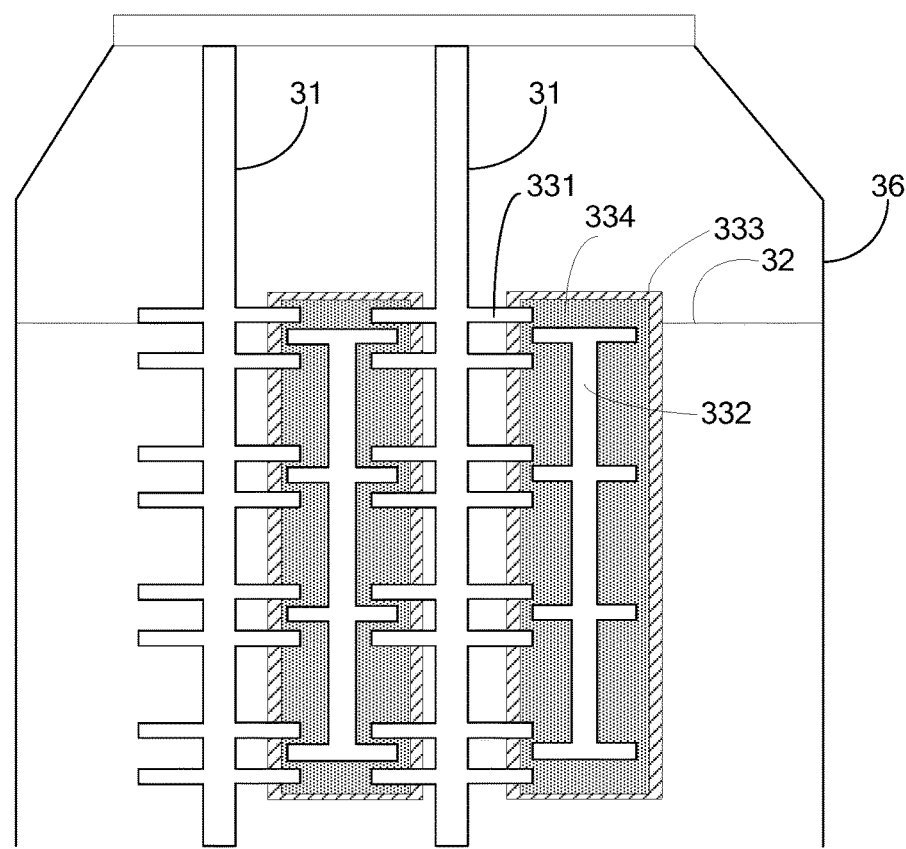
FIG. 11 is a schematic diagram illustrating partial structure of an array substrate provided by one more embodiment of the present disclosure.

In one example, as illustrated in FIG. 11, the electrostatic protection device is simultaneously connected with two adjacent first signal lines 31. Since every first signal line 31 is connected with two electrostatic protection devices, better effect of protection against the static electricity can be achieved.

As described above, the array substrate provided by the embodiment of the present disclosure includes the first signal line, the second signal line and the electrostatic protection device; the electrostatic protection device includes the suspension TFT, wherein the source electrode of the suspension TFT is connected with the first signal line, the gate electrode of the suspension TFT is connected with the second signal line, and the drain electrode of the suspension TFT is suspended; and the drain electrode 332 and the gate electrode 333 have an overlapping region. As compared to the existing array substrate, the first signal line of the array substrate provided by the embodiment of the present disclosure is connected with the suspension TFT such that the first signal line supplies the suspension TFT with the source voltage, and the second signal line supplies the suspension TFT with the gate-on voltage at specific times or periodically so as to turn on the suspension TFT. Therefore, during a turn-on period of the suspension TFT, in case that there are electrostatic charges on the first signal line, the source voltage of the suspension TFT is increased, and then the source electrode and the drain electrode of the suspension TFT are conducted; in this way, a great amount of electrostatic charges are transferred into the electrostatic storage capacitor formed by the drain electrode and the gate electrode of the suspension TFT, and electrostatic breakdown of the first signal line is prevented; in case that the second signal line provides no gate-on voltage, the suspension TFT may be turned off, and then the first signal line and the suspension TFT are in a disconnected state, so that a load of the first signal line is reduced and a normal transmission of the signal on the first signal line is guaranteed, thereby improving the product yield.

An embodiment of the present disclosure further provides a display device which includes the array substrate provided by any embodiment above. The display device can be any product or component with a display function, e.g., a liquid crystal panel, an Organic Light Emitting Diode (OLED) panel, a displayer, a television, a notebook computer, a digital photo frame, a mobile phone, a tablet personal computer, a navigator and the like, without particularly limited in the embodiments of the present disclosure.

The foregoing embodiments merely are exemplary embodiments of the disclosure and not intended to define the scope of the disclosure, and any variations or replacements which can be easily thought of by those skilled in the art in the technical scope of the disclosure shall fall within the scope of disclosure. Therefore, the scope of the disclosure shall be determined by the scope of the appended claims.

The present disclosure claims the benefits of Chinese patent application No. 201520679430.0, which was filed with the SIPO on Sep. 2, 2015 under the title of "ARRAY SUBSTRATE AND DISPLAY DEVICE" and is fully incorporated herein by reference as part of this application.

The invention claimed is:

1. An array substrate, comprising:
a first signal line, a second signal line and an electrostatic protection device, wherein
the electrostatic protection device comprises a suspension Thin Film Transistor (TFT),
wherein a source electrode of the suspension TFT is connected with the first signal line, a gate electrode of the suspension TFT is connected with the second signal line, and a drain electrode of the suspension TFT is suspended, and the drain electrode and the gate electrode have an overlapping region, and wherein every first signal line is connected to at least two electrostatic protection devices.

2. The array substrate according to claim 1, wherein drain electrodes of suspension TFTs in the electrostatic suspension devices connected to a same first signal line are electrically connected with each other.

3. The array substrate according to claim 1, wherein gate electrodes of suspension TFTs in the electrostatic suspension devices connected to a same first signal line are electrically connected with each other.

4. The array substrate according to claim 1, wherein the suspension TFT further comprises an active layer arranged between the gate electrode and the drain electrode, and
active layers of suspension TFTs in the electrostatic protection devices connected to a same first signal line are electrically connected with each other.

5. The array substrate according to claim 1, wherein suspension TFTs in the electrostatic protection devices connected to two adjacent first signal lines share a same drain electrode and a same gate electrode.

6. The array substrate according to claim 1, wherein the electrostatic protection device is connected with two adjacent first signal lines at the same time.

7. The array substrate according to claim 1, wherein the source electrode of the suspension TFT is selected from a group consisted of a U-shaped electrode, an L-shaped electrode and a W-shaped electrode.

8. The array substrate according to claim 1, further comprising a common electrode line, wherein the second signal line is electrically connected with the common electrode line.

9. The array substrate according to claim 8, further comprising a first anti-static unit, wherein
an input end of the first anti-static unit is connected with the second signal line, and an output end of the first anti-static unit is electrically connected with the common electrode line.

10. The array substrate according to claim 1, wherein the first signal line is a gate line or a data line.

11. The array substrate according to claim 1, further comprising a second anti-static unit and a short circuit ring, wherein
an input end of the second anti-static unit is connected with the first signal line, and an output end of the second anti-static unit is connected with the short circuit ring.

12. A display device, comprising the array substrate according to claim 1.

13. The display device according to claim 12, wherein drain electrodes of suspension TFTs in the electrostatic suspension devices connected to a same first signal line are electrically connected with each other.

14. The display device according to claim 12, wherein gate electrodes of suspension TFTs in the electrostatic suspension devices connected to a same first signal line are electrically connected with each other.

15. The display device according to claim 12, wherein the suspension TFT further comprises an active layer arranged between the gate electrode and the drain electrode, and
active layers of suspension TFTs in the electrostatic protection devices connected to a same first signal line are electrically connected with each other.

16. The display device according to claim 12, wherein suspension TFTs in the electrostatic protection devices connected to two adjacent first signal lines share a same drain electrode and a same gate electrode.

17. The display device according to claim 12, wherein the electrostatic protection device is connected with two adjacent first signal lines at the same time.

18. The display device according to claim 12, wherein the array substrate further comprises a common electrode line, wherein the second signal line is electrically connected with the common electrode line.

19. The display device according to claim 18, wherein the array substrate further comprises a first anti-static unit, wherein
an input end of the first anti-static unit is connected with the second signal line, and an output end of the first anti-static unit is electrically connected with the common electrode line.

20. The display device according to claim 12, wherein the array substrate further comprises a second anti-static unit and a short circuit ring, wherein
an input end of the second anti-static unit is connected with the first signal line, and an output end of the second anti-static unit is connected with the short circuit ring.

* * * * *